United States Patent [19]
Fujimoto et al.

[11] Patent Number: 5,675,279
[45] Date of Patent: Oct. 7, 1997

[54] VOLTAGE STEPUP CIRCUIT FOR INTEGRATED SEMICONDUCTOR CIRCUITS

[75] Inventors: Takuya Fujimoto, Kawasaki; Yoshiharu Hirata, Yokohama, both of Japan

[73] Assignee: Kabushiki Kaisha Toshiba, Kawasaki, Japan

[21] Appl. No.: 667,885

[22] Filed: Jun. 20, 1996

Related U.S. Application Data

[63] Continuation of Ser. No. 494,927, Jun. 26, 1995, abandoned, which is a continuation of Ser. No. 186,024, Jan. 25, 1994, abandoned.

Foreign Application Priority Data

Apr. 22, 1993 [JP] Japan ................................ 5-096197

[51] Int. Cl.$^6$ .......................... H03K 3/01; H03K 19/094
[52] U.S. Cl. .......................... 327/536; 327/589; 327/178; 327/306; 327/299
[58] Field of Search .......................... 327/178, 180, 327/306, 309, 390, 401, 534, 536, 537, 313, 315, 291, 299, 589

[56] References Cited

U.S. PATENT DOCUMENTS

| | | | |
|---|---|---|---|
| 3,914,702 | 10/1975 | Gehweiler | 307/304 |
| 4,326,134 | 4/1982 | Owen et al. | 307/268 |
| 4,935,644 | 6/1990 | Tsujimoto | 307/296.2 |
| 4,970,409 | 11/1990 | Wada et al. | 307/296.1 |
| 5,029,282 | 7/1991 | Ito | 307/296.8 |
| 5,043,858 | 8/1991 | Watanabe | 307/482 |
| 5,093,586 | 3/1992 | Asari | 307/296.1 |
| 5,140,182 | 8/1992 | Ichimura | 307/296.1 |
| 5,180,928 | 1/1993 | Choi | 307/296.6 |
| 5,191,232 | 3/1993 | Wang | 307/264 |

OTHER PUBLICATIONS

"On-Chip High-Voltage Generation in MNOS Integrated Circuits Using an Improved Voltage Multiplier Technique" Dickson, J.F., IEEE Journal of Solid-State Circuits, vol. SC-11, No. 3, Jun. 1976, pp. 374-378.

Primary Examiner—Timothy P. Callahan
Assistant Examiner—T. Lam
Attorney, Agent, or Firm—Finnegan, Henderson, Farabow, Garrett & Dunner, L.L.P.

[57] ABSTRACT

A voltage stepup circuit having a plurality of setup circuit units connected in stages between an input voltage node and a stepup voltage node. Each circuit unit comprises at least two first and second MOS transistor T1 and T2. Each of first stepup capacitors is connected between a first clock signal supply node and a first connection node at which the drain and gate of a corresponding one of odd-numbered MOS transistors, of a plurality of MOS transistors connected in series through the plurality of stepup circuit units, are connected together. Each of second stepup capacitors is connected between a second connection node at which the drain and gate of a corresponding one of even-numbered MOS transistors of the plurality of MOS transistors connected together and a second clock signal supply node for supplying said second connection node with a second clock signal whose pulse width does not overlap in time with that of the first clock signal. A first clock amplitude control circuit limits the amplitude of the first clock signal to be supplied to the first clock signal supply node to a predetermined level and applies the first amplitude-limited clock signal to the first clock signal supply node. A second clock amplitude control circuit limits the amplitude of the second clock signal to be supplied to the second clock signal supply node to a predetermined level and applies the second amplitude-limited clock signal to the second clock signal supply node.

5 Claims, 3 Drawing Sheets

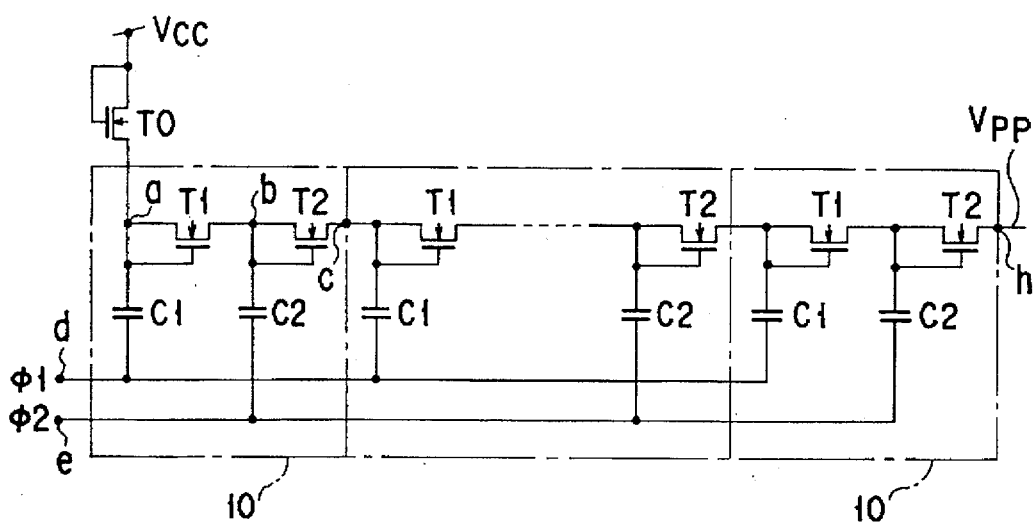
FIG. 1 (PRIOR ART)
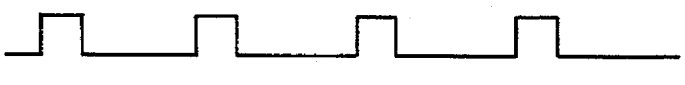
FIG. 2A $\phi_1$
FIG. 2B $\phi_2$
(PRIOR ART)
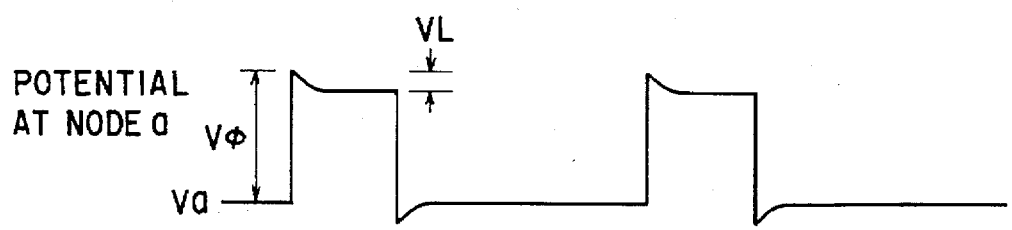
FIG. 3A (PRIOR ART)
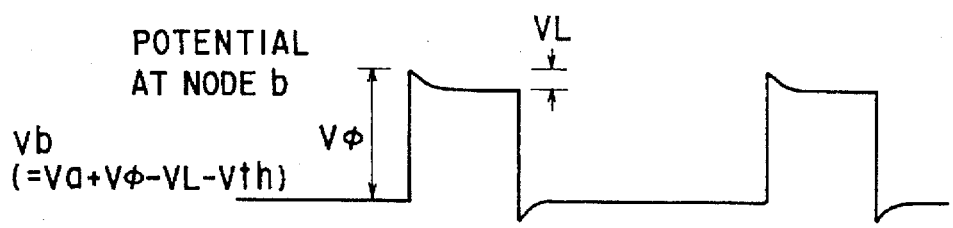
FIG. 3B (PRIOR ART)

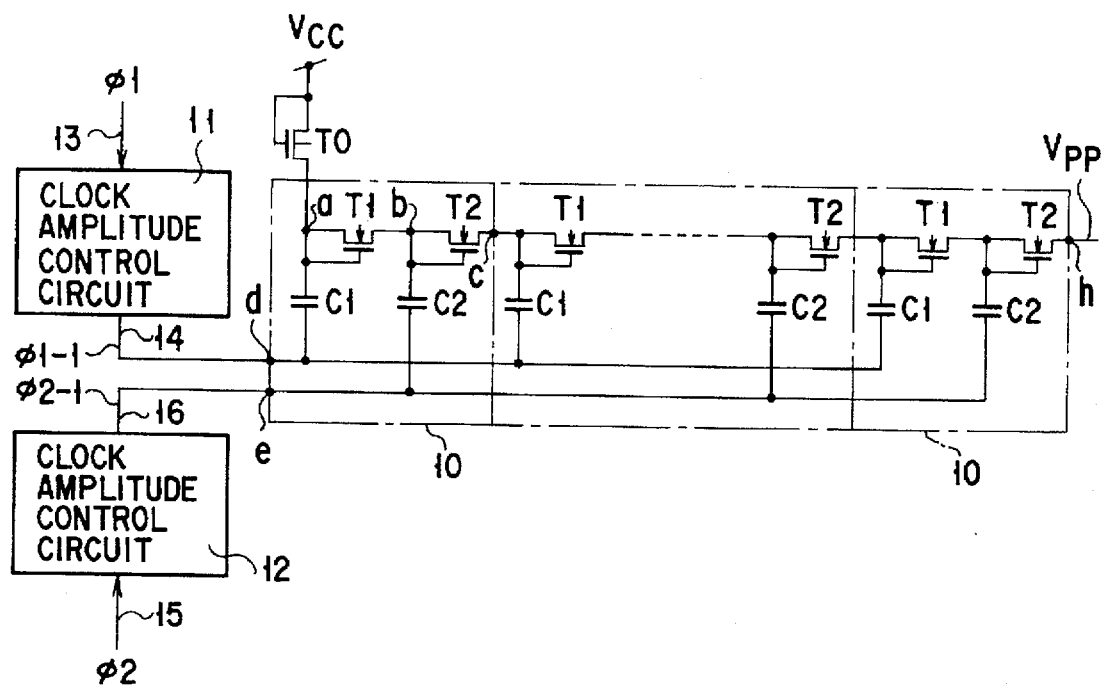
FIG. 4
FIG. 5A  $\phi1$  $\updownarrow V\phi$
FIG. 5B  $\phi2$  $\updownarrow V\phi$
FIG. 5C  $\phi1\text{-}1$  $\updownarrow \overline{V\phi}$
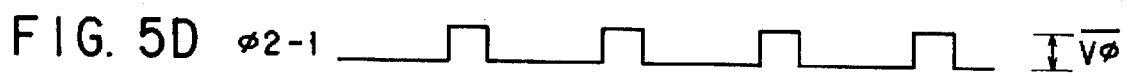
FIG. 5D  $\phi2\text{-}1$  $\updownarrow \overline{V\phi}$

VOLTAGE STEPUP CIRCUIT FOR INTEGRATED SEMICONDUCTOR CIRCUITS

This application is a continuation of application Ser. No. 08/494,927, filed Jun. 26, 1995, now abandoned, which is a continuation of application Ser. No. 08/186,024, filed Jan. 25, 1994, now abandoned.

BACKGROUND OF THE INVENTION

1. Field of the Invention

The present invention relates to a voltage stepup circuit for semiconductor integrated circuits which is used to generate a high voltage needed, for example, for erasing and writing into a nonvolatile semiconductor memory.

2. Description of the Related Art

FIG. 1 shows an example of a prior art voltage stepup circuit which is adapted to generate a high voltage needed for erasing and writing into a nonvolatile semiconductor memory. The prior art is disclosed in J. F. Dickson, "On Chip High-Voltage Generation in MNOS Integrated Circuits Using an Improved Voltage Multiplier Technique", IEEE, J.S.S.C, vol. SC11, p. 374, June '76.

The stepup circuit is composed of a normally ON N-channel MOS transistor T0 having its drain and gate connected together to a stepup input voltage (supply voltage vcc) node and its source connected to a first node a, and a plurality of unit circuits connected in stages between the first node a and a setup output voltage (high voltage Vpp) node h. Each of the unit circuits comprises a plurality of series-connected MOS transistors, T1 and T2, each having its drain and gate connected together, a first stepup capacitor C1 connected between the connection node of the drain and gate of the MOS transistor T1, which is an odd-numbered transistor of the series-connected transistors, and a first clock ($\phi1$) supply node d, and a second stepup capacitor C2 connected between the connection node of the drain and gate of the MOS transistor T2, which is an even-numbered transistor of the series-connected transistors, and a second clock ($\phi2$) supply node e.

The two clock signals $\phi1$ and $\phi2$ are timed, as shown in FIGS. 2A and 2B, such that they will not be at a high level simultaneously.

Next, the operation of each stage of the setup circuit of FIG. 1 will be described with reference to FIGS. 3A and 3B.

When the clock signals $\phi1$ and $\phi2$ are both at a low level, the transistors T1 and T2 are both OFF. As a result, the first node a is maintained at the previous potential Va, and the second node b is maintained at the previous potential Vb.

When the clock signal $\phi1$ goes high with the clock signal $\phi2$ at the low level, the potential at the node a is increased by the amplitude V$\phi$ (equal to the supply voltage Vcc) of the clock signal $\phi1$ through the capacitor C1, resulting in Va+V$\phi$. At this point, the transistor T1 will turn ON to permit discharge current to flow therethrough. Let a voltage drop across the transistor T1 due to the discharge current be represented by VL. Then the node b will be charged to Va+V$\phi$–Vth–VL where Vth is the threshold voltage of the transistor T1.

When the clock signal $\phi1$ returns to the low level and the clock signal $\phi2$ remains low, the transistor T1 turns OFF and the transistor T2 is OFF. As a result, the nodes a and b maintain their respective previous potentials.

When the clock signal $\phi1$ is low and the clock signal $\phi2$ is high, the potential at the node b is increased by the amplitude V$\phi$ of the clock signal $\phi2$ through the stepup capacitor C2, resulting in Vb+V$\phi$. At this point, the transistor T1 is OFF and the transistor T2 turns ON to discharge current. Suppose that the voltage drop across the transistor T2 due to the discharge current is represented by VL. Then, the third node c (the source side of the transistor T2) will be charged to Vb+V$\phi$–Vth–VL where Vth is the threshold voltage of the transistor T2.

The above operation permits a potential increase of 2(V$\phi$–Vth–VL) by each basic unit circuit 10 of the voltage stepup circuit. A desired high voltage Vpp is obtained through a plurality of stages of voltage stepup.

Namely, according to the stepup circuit of FIG. 1, the stepup input voltage (supply voltage) Vcc is successively increased in synchronization with the clock signals $\phi1$ and $\phi2$, thereby producing the high voltage Vpp. Suppose that the specifications of the above-described voltage stepup circuit are that Vcc=2 V and Vpp=20 V, and a potential increase of 1 V is produced by each unit circuit. Then, it will be required that the basic unit circuits be connected in 20 stages.

Near the last stage the backgate effect of the threshold voltage Vth of the MOS transistors T1 and T2 in each basic unit circuit 10 is greater than near the first stage. Even if the MOS transistors T1 and T2 used are of an intrinsic type the initial threshold voltage which is in the order of 0 V, the threshold voltage will become about 1 V in the worst case. In addition, there is a voltage drop VL due to the flow of discharge current through each of the transistors T1 and T2.

In order for the stepup circuit of FIG. 1 to produce a high voltage Vpp of the order of 20 V from a low supply voltage Vcc of the order of 2 V, therefore, it is required that the number of basic unit circuits 10 connected in stages be increased greatly because an increase in potential by each basic unit circuit is small.

Consider now an attempt to obtain a voltage stepup circuit that operates with supply voltages in a wide range of, for example, 2 V to 5 V.

Suppose that the number of the basic unit circuits 10 connected in stages has been set so as to obtain a desired high voltage Vpp with a low supply voltage of, for example, 2 V as described above. If, in this case, it were required to operate the stepup circuit with a high supply voltage of the order of 5 V, then an increase in potential by each stage would be promoted. Therefore, the stepup circuit would have an excessive stepup capability.

In a nonvolatile memory connected to the stepup circuit described above, the application of an excessive voltage to memory cells will adversely affect the reliability of the memory cells. Thus, it might be conceived to connect a voltage limiter for limiting the magnitude of high voltage Vpp to the output of the stepup circuit. However, it would result in an increase in current dissipation.

With the stepup circuit, it is required to enhance the driving capability of a driving buffer circuit (not shown), which is a source of the clock signals $\phi1$ and $\phi2$, with an increase in the number of the basic unit circuits 10 connected in stages. With the driving capability enhanced, charge/discharge current, through current in the buffer circuit would increase in the case of a high stepup input voltage (supply voltage). This would cause the degradation of LSI characteristics, such as an increase in power supply noise.

As described above, the conventional stepup circuit suffers from drawbacks that, when it is designed to operate with supply voltages in a wide range of, for example, 2 to 5 V and it is actually operated from a relatively high voltage in that range, current dissipation and power supply noise increase.

SUMMARY OF THE INVENTION

It is therefore an object of the present to provide a voltage stepup circuit in a semiconductor integrated circuit which, even if a supply voltage, serving as a stepup input voltage, is set in a wide range, does not permit a stepup output voltage to exceed a specific magnitude and permits wasteful current dissipation and power supply noise to be controlled.

According to the present invention there is provided a voltage stepup circuit in a semiconductor integrated circuit comprising:

a plurality of stepup circuit units connected in series between a stepup input voltage node and a stepup output voltage node, each circuit unit comprising at least two first and second MOS transistors T1 and T2 each having its drain and gate connected together;

a plurality of first stepup capacitors each connected between a first connection node at which the drain and gate of a corresponding one of odd-numbered MOS transistors, of a plurality of MOS transistors connected in series through the plurality of stepup circuit units between the stepup input voltage node and the stepup output voltage node, are connected together and a first clock signal supply node for supplying the first connection node with a first clock signal;

a plurality of second stepup capacitors each connected between a second connection node at which the drain and gate of a corresponding one of even-numbered MOS transistors of the plurality of MOS transistors are connected together and a second clock signal supply node for supplying the second connection node with a second clock signal whose pulse width does not overlap in time with that of the first clock signal;

first clock amplitude control circuit means connected to the first clock signal supply node for limiting the amplitude of the first clock signal to be supplied to the first clock signal supply node to a predetermined level regardless of variations in the level of an input voltage and applying first the amplitude-limited clock signal to the first clock signal supply node; and second clock amplitude control circuit means connected to the second clock signal supply node for limiting the amplitude of the second clock signal to be supplied to the second clock signal supply node to a predetermined level when the level of an input voltage is higher than a predetermined value and applying the second amplitude-limited clock signal to the second clock signal supply node.

Therefore, the voltage stepup circuit of the present invention can limit the level of a setup output voltage not to exceed a predetermined value even if the magnitude of a stepup input voltage is set in a wide range. As a result, there is no need of connecting an output voltage limiter and thus current dissipation can be kept from increasing, In addition, even if the number of the stepup circuit units connected in stages is increased, power supply noise can be kept from increasing with increasing driving capability of a clock signal driving buffer circuit.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 shows an example of a conventional voltage stepup circuit for a semiconductor integrated circuit;

FIGS. 2A and 2B are waveform diagrams of clock signals $\phi 1$ and $\phi 2$ applied to the stepup circuit shown in FIG. 1;

FIGS. 3A and 3B are voltage waveform diagrams illustrating the operation of one stage of the stepup circuit shown in FIG. 1;

FIG. 4 shows a voltage stepup circuit according to an embodiment of the present invention;

FIGS. 5A through 5D are waveform diagrams of input clock signals and output clock signals of the clock amplitude control circuits shown in FIG. 4;

DETAILED DESCRIPTION OF THE PREFERRED EMBODIMENTS

Figure 6:
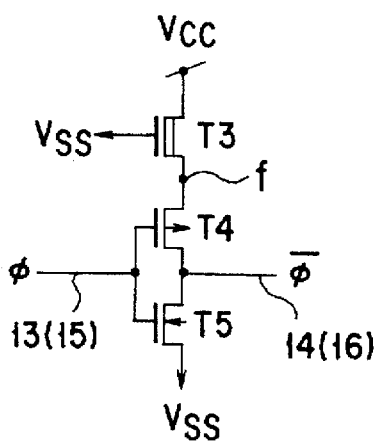
FIG. 6 shows a specific circuit arrangement of the clock amplitude control circuit shown in FIG. 4.

Referring now to FIG. 4, there is shown a circuit arrangement of a voltage stepup circuit for providing a stepup output to a nonvolatile memory according to an embodiment of the present invention.

Unlike the conventional stepup circuit shown in FIG. 1, this stepup circuit is equipped with first and second clock amplitude control circuits 11 and 12 for controlling the amplitudes of clock signals $\phi 1$ and $\phi 2$ according to the magnitude of a supply voltage vcc. Amplitude-limited clock signal output from the control circuits 11 and 12 are applied to first and second stepup capacitors C1 and C2. The stepup circuit of FIG. 4 is the same as the conventional stepup circuit of FIG. 1 for other points. Thus, corresponding parts to those in FIG. 1 are denoted by like reference characters and their descriptions are omitted here.

The stepup circuit of FIG. 4 has a normally ON MOS transistor T0 connected between a stepup input voltage Vcc and a first node a, a plurality of MOS transistors T1 and T2 connected in series between the first node a and a stepup output node h and each having its drain and gate connected together, a plurality of first stepup capacitors C1 each connected between the first clock supply node d and the node at which the drain and gate of a corresponding one of odd-numbered MOS transistors T1, of the series-connected MOS transistors T1 and T2, are connected, and a plurality of second stepup capacitors C2 each connected between the second clock supply node e and the node at which the drain and gate of a corresponding one of even-numbered MOS transistors T2, of the series-connected MOS transistors T1 and T2, are connected.

The voltage stepup circuit of the present invention is characterized by further comprising a first clock amplitude control circuit 11 and a second clock amplitude control circuit 12. The first clock amplitude control circuit 11 receives a first clock signal $\phi 1$ over a first clock input line 13, limits its amplitude to a predetermined level when the level of the supply voltage vcc is higher than a predetermined value, and applies the amplitude-limited clock signal $\phi 1$-1 to the first clock supply node d over a first clock signal output line 14. The second clock amplitude control circuit 12 receives over a second clock input line 15 a second clock signal φ2 which is timed so that it will not be at a high level simultaneously with the first clock signal, limits its amplitude to a predetermined level when the level of the supply voltage Vcc is higher than a predetermined value, and applies the amplitude-limited clock signal φ2-1 to the second clock supply node e over a second clock signal output line 16.

The stepup circuit of FIG. 4 is chiefly composed of a plurality of basic unit circuits 10 connected in cascade, each of which comprises the first stepup capacitor C1 connected between the first node a supplied with a stepup input voltage and the first clock supply node d, the first MOS transistor T1 having its drain-source path connected between the first node a and a second node b and turned ON or OFF by a potential at the first node a, the second stepup capacitor C2 connected between the second node b and the second clock supply node e, and the second MOS transistor T2 having its drain-source path connected between the second node b and a third node c and turned ON or OFF by a potential at the second node b. The first and second clock supply nodes d and e of each stage are connected to receive the first and second amplitude-limited clock signals φ1-1 and φ2-1 from the first and second clock amplitude control circuits 11 and 12, respectively.

FIGS. 5A through 5D are waveform diagrams illustrating the times when the clock signals φ1 and φ2 are respectively applied to and the amplitude-limited clock signals φ1-1 and φ2-1 are respectively delivered from the first and second clock amplitude control circuits 11 and 12.

The clock amplitude control circuits 11 and 12 limit the amplitude Vφ (=Vcc) of the input clock signals φ1 and φ2 to a predetermined level when the level of the supply voltage is higher than a predetermined value and apply the amplitude-limited clock signals φ1-1 and φ2-1 with an amplitude of $\overline{V\phi}$ to the stepup capacitors C1 and C2 in the stepup unit circuit 10. Thereby, as in the conventional stepup circuit described previously, the supply voltage Vcc is stepped up successively in synchronization with the amplitude-limited signals φ1-1 and φ2-1, producing a high voltage Vpp.

In this case, an increase in potential by each unit circuit is limited to $2(\overline{V\phi}-Vth-VL)$. Thus, excessive stepup can be avoided when the supply voltage vcc is high, the need for use of an output voltage limiter for limiting the magnitude of a high-voltage output is eliminated, and a waste of current dissipation can be controlled.

When the amplitude-limited clock signals φ1-1 and φ2-1 are subjected to level shift control so that their amplitude will not exceed the supply voltage, the charge/discharge current and the through current in the clock signal driving buffer circuit can be limited, which keeps power supply noise from increasing.

FIG. 6 shows a specific circuit arrangement of the first and second clock amplitude control circuits 11 and 12 of FIG. 4.

This control circuit is composed of a third MOS transistor T3 having its drain connected to the supply voltage Vcc node and its gate connected to ground potential Vss, and fourth and fifth MOS transistors T4 and T5 connected in series between the source of the third transistor T3 and the ground potential Vss node. The fourth and fifth MOS transistors T4 and T5 have their gates connected together to receive the clock signal φ (φ1 or φ2) over the first or second clock signal input line 13 or 15. From the common drains of the fourth and fifth MOS transistors T4 and T5 the amplitude-limited clock signal $\overline{\phi}$ (φ1-1 or φ2-1) is output onto the clock signal output line 14 or 16.

In the present case, the third MOS transistor T3 consists of an N-channel depletion device, the fourth MOS transistor T4 consists of a P-channel device, and the fifth MOS transistor T5 consists of an N-channel device. The fourth and fifth MOS transistors form a CMOS inverter.

Figure 7:
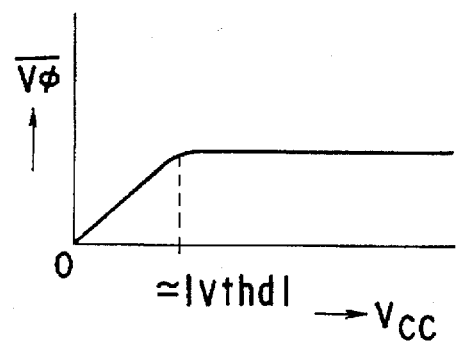
FIG. 7 shows the control characteristic of the circuit of FIG. 6.

FIG. 7 shows an example of the amplitude control characteristic (supply voltage Vcc versus clock signal output amplitude Vφ) of the clock amplitude control circuit of FIG. 6.

Figure 8:
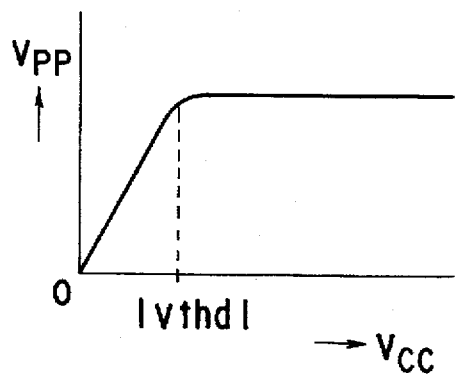
FIG. 8 shows the stepup characteristic of the circuit of FIG. 6.

FIG. 8 shows an example of the voltage stepup characteristic (supply voltage vcc versus output voltage Vpp) when the clock amplitude control circuits of FIG. 4 are each arranged as shown in FIG. 6.

Hereinafter, the operation of the clock amplitude control circuit and the characteristics of the stepup circuit of FIG. 4 will be described with reference to FIGS. 7 and 8.

Let the threshold voltage of the N-channel depletion transistor T3 in the clock amplitude control circuit of FIG. 6 be represented by Vthd. Then, the transistor T3 will turn OFF when the potential at its source (node f) goes to |Vthd|. Thereby, the potential at node f is limited to |Vthd| and does not exceed it. The threshold voltage |Vthd| is determined at the time of manufacture of the transistor T3.

Since the source of the P-channel transistor T4 in the CMOS inverter is connected to the node f, the level $\overline{V\phi}$ of an output signal (clock signal $\overline{\phi}$) of the CMOS inverter increases in proportion to the supply voltage Vcc in the range below Vthd, but it is limited to Vthd in the range above Vthd.

As described above, in the stepup circuit an increase in potential by each unit circuit is $2(\overline{V\phi}-Vth-VL)$. If Vth and VL are fixed, the level $\overline{V\phi}$ of the clock signal $\overline{\phi}$ is fixed at |Vthd| when the level of the supply voltage Vcc is higher than a predetermined value. This also permits the output voltage Vpp to hold fixed.

By setting the magnitude of the threshold voltage Vthd arbitrarily, it is easy to set the amplitude $\overline{V\phi}$ of the clock signal φ and the output voltage Vpp at desired values. In this case, by setting the clock signal amplitude $\overline{V\phi}$ to less than the supply voltage Vcc, the charge/discharge current and the through current in the clock signal driving buffer circuit can be suppressed, keeping power supply noise from increasing.

Figure 9:
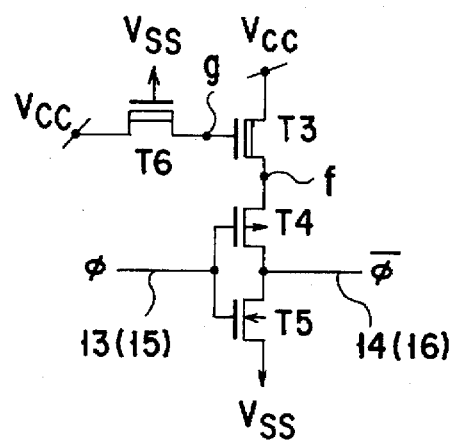
FIG. 9 shows a modification of the circuit of FIG. 6.

FIG. 9 shows a modification of the clock amplitude control circuit of FIG. 6.

This control circuit differs from the clock amplitude control circuit of FIG. 6 in that, instead of being connected to Vss as in FIG. 6, the gate of the third transistor T3 is connected to Vcc node via the drain-source path of a sixth MOS transistor T6 of N-channel depletion type which has its gate connected to the Vss potential. Both circuits are the same in other respects, and thus corresponding parts to those in FIG. 6 are denoted by like reference characters.

Figure 10:
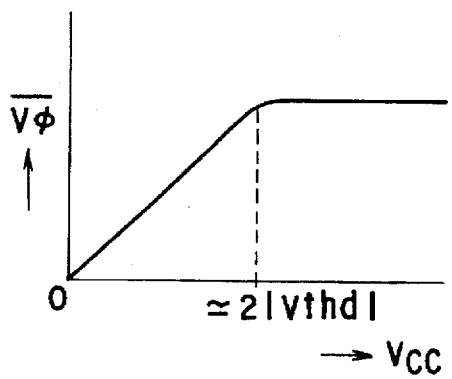
FIG. 10 shows the control characteristic of the circuit of FIG. 9.

FIG. 10 shows an example of the clock amplitude control characteristic (supply voltage vcc versus clock signal output amplitude Vφ) of the clock amplitude control circuit of FIG. 9.

Figure 11:
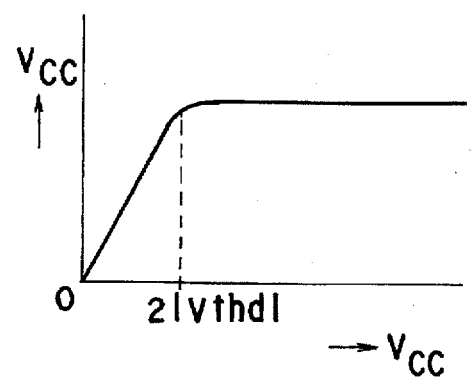
FIG. 11 shows the stepup characteristic of the circuit of FIG. 9.

FIG. 11 shows an example of the stepup characteristic (supply voltage Vcc versus output voltage Vpp) of the stepup circuit of FIG. 4 when the clock amplitude control circuits 11 and 12 are each arranged as shown in FIG. 9.

Basically the clock amplitude control circuit of FIG. 9 operates identically to the clock amplitude control circuit of FIG. 6, but the addition of the depletion transistor T6 permits the following operation.

That is to say, the transistor T6 turns OFF when the potential at its source (node g) goes to |Vthd|, the threshold voltage of the transistor T6. Thereby, the gate potential of the transistor T3 is limited to |Vthd| and does not exceed it.

Thus, the transistor T3 turns OFF when the potential at the source (node f) of the transistor T3 goes to |Vthd|+|Vthd|= 2|Vthd|. Thereby, the potential at the gate of the transistor T3 is limited to 2|Vthd| and does not exceed it.

Since the source of the P-channel transistor T4 in the CMOS inverter is connected to the node f, the level $\overline{V\phi}$ of the output signal (clock signal $\phi$) of the CMOS inverter rises in proportion to the magnitude of the supply voltage Vcc in the range below 2Vthd, but it is limited to 2|Vthd| when the level of the supply voltage is higher than a predetermined value.

As described above, in the stepup circuit an increase in potential by each unit circuit is $2(\overline{V\phi}-Vth-VL)$. If Vth and VL are fixed, then the level $\overline{V\phi}$ of the clock signal $\phi$ will be fixed at 2|Vthd| when the supply voltage Vcc is in the range above 2|Vthd|. This also permits the output voltage Vpp to hold fixed.

With the clock amplitude control circuit of FIG. 9 as well, by setting the magnitude of the threshold voltage Vthd arbitrarily, it is made easy to set the output voltage Vpp at desired values.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What claimed is:

1. A voltage stepup circuit, comprising:

a plurality of stepup circuit units connected in series between an input voltage node receiving a supply voltage and an output voltage node, each stepup circuit unit comprising a first MOS and a second MOS transistor connected in series, each first and second MOS transistor having a drain and a gate connected together, each second MOS transistor having a source connected to the drain and gate of a first MOS transistor of a next series-connected stepup circuit unit, the source of the second MOS transistor of a last one of said plurality of stepup circuit units being connected to the output voltage node, and the drain and the gate of the first MOS-transistor of a first one of said plurality of stepup circuit units being connected to the input voltage node;

a plurality of first stepup capacitors respectively connected between the drain and gate of the first MOS transistors of said plurality of stepup circuit units and a first clock signal supply node;

a plurality of second stepup capacitors respectively connected between the drain and gate of the second MOS transistors of said plurality of stepup circuit units and a second clock signal supply node;

first clock amplitude control circuit means for receiving a first clock signal, and for supplying a first amplitude-limited clock signal amplitude-limited to a predetermined level regardless of variations in the level of the supply voltage to the first clock signal supply node; and second clock amplitude control circuit means for receiving a second clock signal, and for supplying second amplitude-limited clock signal amplitude-limited to a predetermined level regardless of variations in the level of the supply voltage to the second clock signal supply node, said second amplitude-limited clock signal having a pulse width which does not overlap in time with that of the first amplitude-limited clock signal.

2. A stepup circuit according to claim 1, wherein each of the first and second clock amplitude control circuit mean comprises:

a third MOS transistor having one end connected to the input voltage node and a gate connected to ground potential;

a fourth MOS transistor having one end connected to an other end of the third MOS transistor, a gate connected to receive a corresponding one of the first and second clock signals, and an other end connected to a corresponding one of the first and second clock signal supply nodes; and a fifth MOS transistor having one end connected to the other end of the fourth MOS transistor and to the corresponding one of the first and second clock signal supply nodes, a gate connected to receive the corresponding one of the first and second clock signals, and an other end connected to ground potential.

3. A stepup circuit according to claim 2, wherein the third MOS transistor is an N-channel depletion transistor, the fourth MOS transistor is a P-channel MOS transistor, and the fifth MOS transistor is an N-channel transistor.

4. A stepup circuit according to claim 1, wherein each of the first and second clock amplitude control circuit means comprises:

a third MOS transistor having one end connected to the input voltage node;

a fourth MOS transistor having one end connected to an other end of the third MOS transistor, a gate connected to receive a corresponding one of said first and second clock signals, and an other end connected to a corresponding one of the first and second clock signal supply nodes;

a fifth MOS transistor having one connected to the other end of the fourth MOS transistor and to the corresponding one of the first and second clock signal supply nodes, a gate connected to receive the corresponding one of the first and second clock signals, and an other end connected to ground potential; and a sixth MOS transistor having one end connected to the input voltage node, a gate connected to ground potential, and an other end connected to the gate of the third MOS transistor.

5. A stepup circuit according to claim 4, wherein the third MOS transistor and the sixth MOS transistors are N-channel depletion transistors, the fourth MOS transistor is a P/channel MOS transistor, and the fifth MOS transistor is an N-channel transistor.

* * * * *

UNITED STATES PATENT AND TRADEMARK OFFICE
CERTIFICATE OF CORRECTION

PATENT NO. : 5,675,279
DATED : October 07, 1997
INVENTOR(S) : Takuya FUJIMOTO et al.

It is certified that error appears in the above-indentified patent and that said Letters Patent is hereby corrected as shown below:

Claim 1, column 7, line 38, after "first MOS" insert --transistor--.

Claim 1, column 8, line 2, after "supplying", insert --a--.

Claim 2, column 8, line 10, "mean" should read --means--.

Signed and Sealed this

Sixteenth Day of June, 1998

BRUCE LEHMAN

Attest:

Attesting Officer

Commissioner of Patents and Trademarks